United States Patent
Platz et al.

(10) Patent No.: US 8,039,958 B2
(45) Date of Patent: Oct. 18, 2011

(54) SEMICONDUCTOR DEVICE INCLUDING A REDUCED STRESS CONFIGURATION FOR METAL PILLARS

(75) Inventors: Alexander Platz, Ebersbach (DE); Matthias Lehr, Dresden (DE); Frank Kuechenmeister, Dresden (DE)

(73) Assignee: Advanced Micro Devices, Inc., Austin, TX (US)

(*) Notice: Subject to any disclaimer, the term of this patent is extended or adjusted under 35 U.S.C. 154(b) by 20 days.

(21) Appl. No.: 12/575,618

(22) Filed: Oct. 8, 2009

(65) Prior Publication Data

US 2010/0109158 A1 May 6, 2010

(30) Foreign Application Priority Data

Oct. 31, 2008 (DE) .................. 10 2008 054 054

(51) Int. Cl.
*H01L 29/40* (2006.01)
(52) U.S. Cl. .......... 257/737; 257/E21.295; 257/E23.068
(58) Field of Classification Search ................. 257/737, 257/E21.295, E23.068
See application file for complete search history.

(56) References Cited

U.S. PATENT DOCUMENTS

| | | | |
|---|---|---|---|
| 2003/0025202 A1 | 2/2003 | Mikagi et al. | 257/737 |
| 2004/0175914 A1 | 9/2004 | Shizuno et al. | 438/613 |
| 2005/0017376 A1* | 1/2005 | Tsai | 257/786 |
| 2008/0169562 A1 | 7/2008 | Ke et al. | 257/737 |

FOREIGN PATENT DOCUMENTS

DE 102007050610 A1 5/2008

OTHER PUBLICATIONS

Translation of Official Communication from German Patent Office for German Patent Application No. 10 2008 054 054.4 dated Jun. 4, 2009.
Translation of Official Communication from European Patent Office re: International Application No. PCT/EP2009/007549 dated Jan. 14, 2011.

\* cited by examiner

*Primary Examiner* — Thanh V Pham
*Assistant Examiner* — Marvin Payen
(74) *Attorney, Agent, or Firm* — Williams, Morgan & Amerson

(57) ABSTRACT

In a metallization system of a sophisticated semiconductor device, metal pillars may be provided so as to exhibit an increased efficiency in distributing any mechanical stress exerted thereon. This may be accomplished by significantly increasing the surface area of the final passivation layer that is in tight mechanical contact with the metal pillar.

16 Claims, 10 Drawing Sheets

SEMICONDUCTOR DEVICE INCLUDING A REDUCED STRESS CONFIGURATION FOR METAL PILLARS

BACKGROUND OF THE INVENTION

1. Field of the Invention

Generally, the present disclosure relates to integrated circuits, and, more particularly, to the techniques for reducing chip-package interactions caused by thermal mismatch between the chip and the package.

2. Description of the Related Art

Semiconductor devices are typically formed on substantially disc-shaped substrates made of any appropriate material. The majority of semiconductor devices including highly complex electronic circuits are currently, and in the foreseeable future will be, manufactured on the basis of silicon, thereby rendering silicon substrates and silicon-containing substrates, such as silicon-on-insulator (SOI) substrates, viable base materials for forming semiconductor devices, such as microprocessors, SRAMs, ASICs (application specific ICs), systems on chip (SoC) and the like. The individual integrated circuits are arranged in an array on the wafer, wherein most of the manufacturing steps, which may involve several hundred and more individual process steps in sophisticated integrated circuits, are performed simultaneously for all chip areas on the substrate, except for photolithography processes, metrology processes and packaging of the individual devices after dicing the substrate. Thus, economical constraints drive semiconductor manufacturers to steadily increase the substrate dimensions, thereby also increasing the area available for producing actual semiconductor devices and thus increasing production yield.

In addition to increasing the substrate area, it is also important to optimize the utilization of the substrate area for a given substrate size so as to actually use as much substrate area as possible for semiconductor devices and/or test structures that may be used for process control. In the attempt to maximize the useful surface area for a given substrate size, the feature sizes of circuit elements are steadily scaled down. Due to this ongoing demand for shrinking the feature sizes of highly sophisticated semiconductor devices, copper, in combination with a low-k dielectric material, has become a frequently used alternative in the formation of so-called interconnect structures, comprising metal line layers and intermediate via layers that include metal lines as intra-layer connections and vias as inter-layer connections, which commonly connect individual circuit elements to provide the required functionality of the integrated circuit. Typically, a plurality of metal line layers and via layers stacked on top of each other is necessary to realize the connections between all internal circuit elements and I/O (input/output), power and ground pads of the circuit design under consideration.

For extremely scaled integrated circuits, the signal propagation delay is no longer limited by the circuit elements, such as field effect transistors and the like, but is limited, owing to the increased density of circuit elements requiring an even more increased number of electrical connections, by the close proximity of the metal lines, since the line-to-line capacitance is increased, in combination with a reduced conductivity of the lines due to a reduced cross-sectional area. For this reason, traditional dielectrics, such as silicon dioxide ($k>4$) and silicon nitride ($k>7$), are replaced by dielectric materials having a lower permittivity, which are therefore also referred to as low-k dielectrics, having a relative permittivity of 3 or less. However, the density and mechanical stability or strength of the low-k materials may be significantly less compared to the well-approved dielectrics silicon dioxide and silicon nitride. As a consequence, during the formation of the metallization system and any subsequent manufacturing processes of integrated circuits, production yield may depend on the mechanical characteristics of sensitive dielectric materials, such as low-k dielectric layers, and their adhesion to other materials.

In addition to the problems of reduced mechanical stabilities of advanced dielectric materials having a dielectric constant of 3.0 and significantly less, device reliability may be affected by these materials during operation of sophisticated semiconductor devices due to an interaction between the chip and the package caused by a thermal mismatch of the corresponding thermal expansion of the different materials. For instance, in the fabrication of complex integrated circuits, increasingly, a contact technology may be used in connecting the package carrier to the chip, which is known as flip chip packaging technique. Contrary to the well-established wire bonding techniques in which appropriate contact pads may be positioned at the periphery of the very last metal layer of the chip, which may be connected to corresponding terminals of the package by a wire, in the flip chip technology, a respective bump structure may be formed on the last metallization layer, for instance comprised of a solder material, which may be brought into contact with respective contact pads of the package. Thus, after reflowing the bump material, a reliable electrical and mechanical connection may be established between the last metallization layer and the contact pads of the package carrier. In this manner, a very large number of electrical connections may be provided across the entire chip area of the last metallization layer with reduced contact resistance and parasitic capacitance, thereby providing the IO (input/output) capabilities, which may be required for complex integrated circuits, such as CPUs, storage memories and the like. During the corresponding process sequence for connecting the bump structure with a package carrier, a certain degree of pressure and/or heat may be applied to the composite device to establish a reliable connection between each of the bumps formed on the chip and the bumps or pads that may be provided on the package substrate. The thermally or mechanically induced stress may, however, also act on the lower-lying metallization layers, which may typically include low-k dielectrics or even ultra low-k (ULK) dielectric materials, thereby significantly increasing the probability of creating defects by delamination of these sensitive materials due to reduced mechanical stability and adhesion to other materials.

Moreover, during operation of the finished semiconductor device attached to a corresponding package substrate, significant mechanical stress may occur due to a significant mismatch in the thermal expansion behavior of the silicon-based semiconductor chip and the package substrate, since, in volume production of sophisticated integrated circuits, economic constraints typically require the usage of specified substrate materials for the package, such as organic materials, which typically may exhibit a different thermal conductivity and a coefficient of thermal expansion compared to the silicon chip.

In recent developments, the thermal and electrical performance of a "bump structure" is increased by providing copper pillars instead of solder bumps or balls, thereby reducing the required floor space for individual contact elements and also enhancing thermal and electrical conductivity, due to the superior characteristics of copper compared to typically used solder material. These copper pillars may, however, contribute to an even more severe interaction between the package and the metallization system of the chip, since, typically, the copper pillars are significantly less deformable compared to the bump structures, which may be advantageous in view of electrical and thermal behavior which, however, may result in even increased mechanical stress components in a locally very restricted manner, as will be described in more detail with reference to FIG. 1.

FIG. 1 schematically illustrates a cross-sectional view of an integrated circuit 150 comprising a semiconductor die or chip 100 connected to a package substrate 180 that is substantially comprised of an organic material, such as appropriate polymer materials and the like, wherein the connection between the chip 100 and the package substrate 180 may be accomplished by means of a pillar structure 170. The semiconductor chip 100 may typically comprise a substrate 101, for instance a silicon substrate or an SOI substrate, depending on the overall configuration of the circuit layout and the performance of the integrated circuit 150. Moreover, a silicon-based semiconductor layer 102 may typically be provided "above" the substrate 101, wherein the semiconductor layer 102 may comprise a very large number of circuit elements, such as transistors, capacitors, resistors and the like, as are required for the desired functional behavior of the integrated circuit 150. As previously discussed, the ongoing shrinkage of critical dimensions of circuit elements may result in critical dimensions of transistors on the order of magnitude of 50 nm and significantly less in presently available sophisticated semiconductor devices produced by volume production techniques. The semiconductor chip 100 comprises a metallization system 110, which, in advanced devices, comprises a plurality of metallization layers, i.e., device levels, in which metal lines and vias are embedded in an appropriate dielectric material. As discussed above, at least a portion of the corresponding dielectric materials used in the various metallization layers is usually comprised of materials of reduced mechanical stability in order to produce the parasitic capacitance of adjacent metal lines. As previously explained, the pillar structure 170 may be provided as a part of the metallization system 110, wherein the corresponding copper pillars are provided in the very last metallization layer of the system 110. On the other hand, the package substrate 180 comprises appropriately positioned and dimensioned contact pads (not shown) which may be brought into contact with corresponding pillars or any solder material formed thereon, in order to establish respective mechanical and electrical connections upon application of heat and/or mechanical pressure. Furthermore, the package substrate 180 usually comprises appropriate conductive lines in order to connect the upper pillars of the pillar structure 170 with corresponding terminals, which then establish an electrical interface to other peripheral components, such as a printed wiring board and the like. For convenience, any such conductive lines are not shown.

During operation of the integrated circuit 150, heat is generated within the semiconductor chip 100, for instance caused by the circuit elements formed in and above the semiconductor layer 102. This waste heat is dissipated, for instance, by the metallization system 110 and the pillar structure 170 in a highly efficient manner and/or via the substrate 101, depending on the overall thermal conductivity of the substrate 101. For example, the heat dissipation capability of SOI substrates is significantly less compared to pure silicon substrates due to the reduced thermal conductivity of the buried insulating oxide layer, which separates the semiconductor layer 102 from the remaining substrate material. Thus, a major heat dissipation path is provided by the pillar structure 170 and the package substrate 180. Consequently, a moderately high average temperature is created in the semiconductor chip 100 and also in the package substrate 180, wherein, as previously discussed, a mismatch in the coefficient of thermal expansion between these two components may cause a significant mechanical stress. As is, for instance, indicated by arrows 103 and 173, the package substrate 180 may have an increased thermal expansion compared to the semiconductor chip 100, wherein a corresponding mismatch therefore results in a significant degree of thermal stress, in particular at the "interface" between the semiconductor chip 100 and the package substrate 180, that is, in particular the pillar structure 170 and the metallization system 110 may experience significant sheer forces caused by the thermal mismatch during the operation of the integrated circuit 150. Due to the reduced mechanical stability and the reduced adhesion of sophisticated dielectric materials, corresponding defects may occur which may affect the overall reliability of the integrated circuit 150. In particular, the stiffness of the individual pillars of the pillar structure 170 may result in locally high sheer forces, which are transferred into the entire metallization system, thereby resulting in delamination defects and the like. Consequently, although advanced contact regimes between a chip and a package substrate based on copper pillars may provide significant advances with respect to heat dissipation capabilities and electrical conductivity for a reduced required floor space, thereby allowing enhanced density of contact elements and/or dummy elements for heat dissipation, the increased mechanical stress induced in the metallization system may not be compatible with the reliability requirements of the semiconductor devices. For this reason, frequently, the height of the copper pillars is reduced which, however, may be associated with a corresponding reduction of the spacing between the package substrate and the chip, which in turn may cause a non-reliable filling in of any underfill material. Thus, corresponding voids in the underfill material may also contribute to a high degree of non-reliability, for instance caused by non-uniformities in heat conductivity and the like. In some conventional approaches, therefore, the reduced pillar height is compensated for by adding a lead-free solder cap, thereby maintaining a desired distance between the package substrate and the chip. However, a corresponding manufacturing strategy is associated with increased costs due to a significantly increased manufacturing complexity in providing the solder material on top of the copper pillars. In further conventional approaches, the metallization systems may be formed on the basis of less sensitive low-k materials or ultra low-k materials in order to enhance the mechanical stability of the metallization system, which, however, is associated with a significant reduction in electrical performance due to increased parasitic capacitances, resulting in increased signal propagation delay.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure relates to semiconductor devices and manufacturing techniques in which mechanical stress transferred via a pillar structure from a package substrate into a metallization system of a complex integrated circuit may be "distributed" across an increased surface area, thereby reducing the local stress load compared to conventional strategies. The mechanical stress distribution may be accomplished by increasing the surface portion of a final passivation layer of the metallization system that is in tight mechanical contact with the pillar so that the final passivation layer may act as a stress buffer layer or may distribute the mechanical stress more efficiently, thereby reducing the probability of creating stress-related defects throughout the entire metallization system, even if sophisticated dielectric materials are used. In some illustrative aspects disclosed herein, the stress distribution may be accomplished via a stress distribution element or component, which may be understood as an element that is in direct mechanical contact with the pillar and also with the dielectric material of the final passivation layer, thereby providing an increased surface area that is available for stress transfer from the pillar into the dielectric material of the final passivation layer. In some illustrative embodiments, the stress distribution element may be positioned within the final passivation layer so that large area contact with the dielectric material may be accomplished, thereby acting as an "anchor" of the pillar. In other cases, the stress distribution layer may be formed on the final passivation layer, thereby circumferentially enclosing the pillar. In other illustrative aspects disclosed herein, during the manufacturing sequence for forming the pillar structure, appropriate parameters, such as the thickness of the final passivation layer, the diameter of a corresponding opening connecting to the contact pad and the diameter of the pillar, may be appropriately selected to provide an increased surface area into which the mechanical stress of the pillar may be received and finally transferred into the final passivation layer. Consequently, the local stress load may be maintained at an acceptable level while also providing the possibility of maintaining a desired spacing or height of the pillar and without adding to undue process complexity.

One illustrative semiconductor device disclosed herein comprises a metallization system formed above a substrate, wherein the metallization system comprises a plurality of metallization layers and a final contact layer comprising a contact pad. Furthermore, a final passivation layer is formed above the final contact layer and comprises an opening that is aligned to the contact pad. Furthermore, a metal pillar extends from the final passivation layer and is in electrical contact with the contact pad. Moreover, the semiconductor device comprises a stress distribution element formed in contact with the final passivation layer, wherein the stress distribution element is in contact with a portion of the metal pillar so as to increase an effective area for stress transfer from the metal pillar to the final passivation layer.

One illustrative method disclosed herein comprises forming a final passivation layer above a metallization system of a semiconductor device wherein the metallization system comprises a contact pad. Furthermore, an opening is formed in the final passivation layer that is aligned to the contact pad. Additionally, a stress distribution region is formed on the basis of a mask that defines a lateral size of the stress distribution region, wherein the stress distribution region is in contact with the final passivation layer. Furthermore, a deposition mask is formed above the final passivation layer and a metal pillar is formed by using the deposition mask, wherein the metal pillar extends from the stress distribution region.

A further illustrative method disclosed herein relates to the formation of a semiconductor device. The method comprises forming a final passivation layer above a plurality of metallization layers and forming an opening in the final passivation layer so as to expose a portion of a contact pad. The method further comprises forming a metal pillar extending from the final passivation layer and connecting to the contact pad. The method additionally comprises controlling at least one of the following conditions: a ratio of a thickness of the final passivation layer and a diameter of the metal pillar so as to be approximately 0.5 or greater; and a ratio of the diameter of the metal pillar and a diameter of the opening so as to be approximately 1.5 or greater.

BRIEF DESCRIPTION OF THE DRAWINGS

The disclosure may be understood by reference to the following description taken in conjunction with the accompanying drawings, in which like reference numerals identify like elements, and in which.

Figure 1:
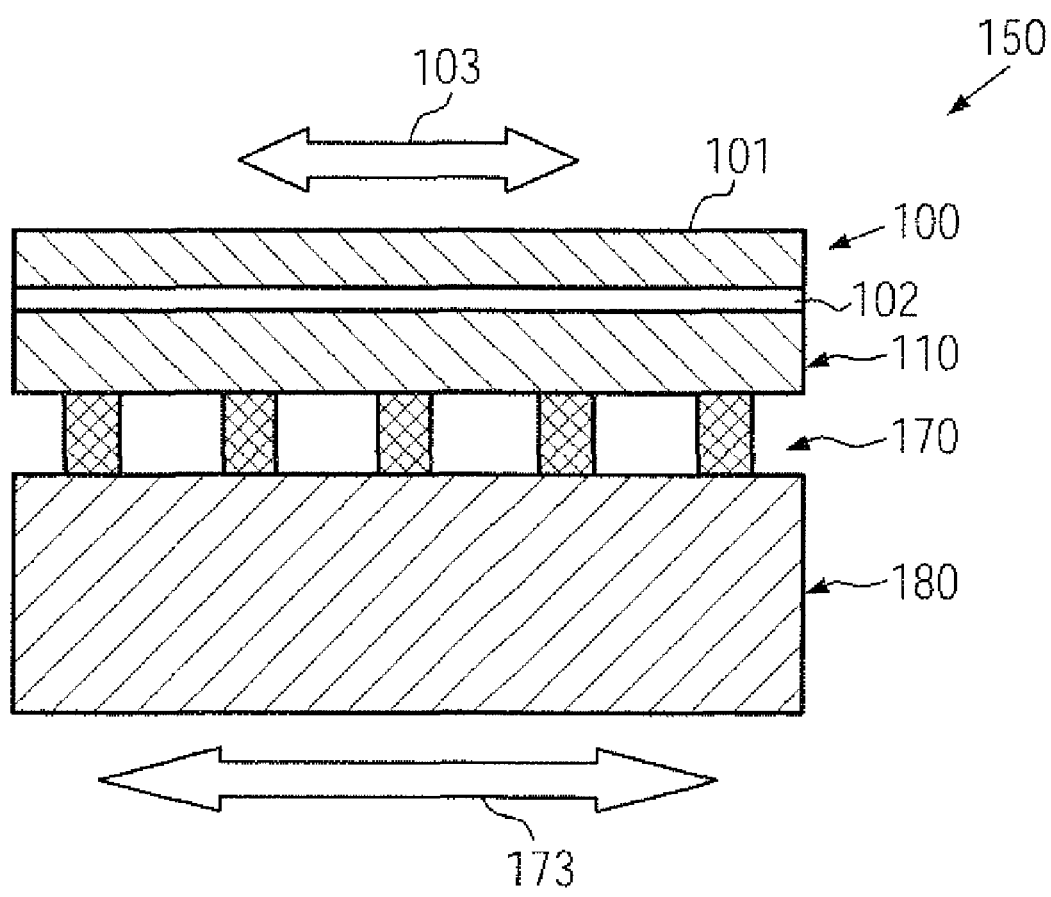
FIG. 1 schematically illustrates a cross-sectional view of an integrated circuit including a semiconductor chip and a package substrate connected by a pillar structure, according to conventional designs.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure provides semiconductor devices and techniques in which sophisticated metallization systems including metal pillars may be efficiently used without unduly increasing the local stress load for the metallization system, thereby providing the possibility of using highly sophisticated dielectric materials, which may have a reduced mechanical stability compared to conventional dielectrics, as previously explained. The local stress load may be efficiently reduced for a given configuration of the pillars by distributing or buffering the mechanical stress, which may be accomplished by significantly increasing the surface area of the final passivation layer that is tightly mechanically connected to the pillar. For this purpose, in some illustrative embodiments, a stress distribution component or element may be provided to act as an "anchor" of the pillar so that the stress distribution component may adhere to an increased surface area of the final passivation layer, which may thus exert a less pronounced stress level to the underlying regions of the metallization system. For example, the stress distribution component may be embedded in the final passivation layer or may be formed such that a portion thereof is provided on the surface of the final passivation layer. In addition to or alternatively to providing a corresponding stress distribution element or anchor for the metal pillar, the dimensions of the final passivation layer and/or the corresponding opening formed therein may be appropriately selected with respect to the desired diameter of the metal pillar so as to provide an increased contact area between the metal pillar and the final passivation layer. That is, upon increasing the thickness of the final passivation layer, the surface layer thereof that is in contact with a portion of the metal pillar extending through the passivation layer to the contact pad may be appropriately increased so that a significant amount of mechanical stress may be transferred into the passivation layer, which may then provide the desired degree of distribution of the mechanical stress component. In addition to this measure, or alternatively, the width or diameter of the corresponding opening in the passivation layer may be reduced relative to the diameter of the metal pillar, i.e., with respect to the component that extends from the final passivation layer, so that the surface area of the metal pillar that is positioned on the final passivation layer is significantly increased, which may also contribute to enhanced stress distribution efficiency. Consequently, respective geometrical configurations of the metal pillar may be selected in accordance with well-established process strategies, that is, an appropriate height thereof may be used to ensure a proper spacing between the semiconductor chip and a corresponding package substrate, while nevertheless a reduced local stress load may occur in the vicinity of the corresponding metal pillars, thereby allowing the usage of sophisticated metallization regimes.

With reference to FIGS. 2a-2h, further illustrative embodiments will now be described in more detail, wherein reference may also be made to FIG. 1, if appropriate.

Figure 2A:
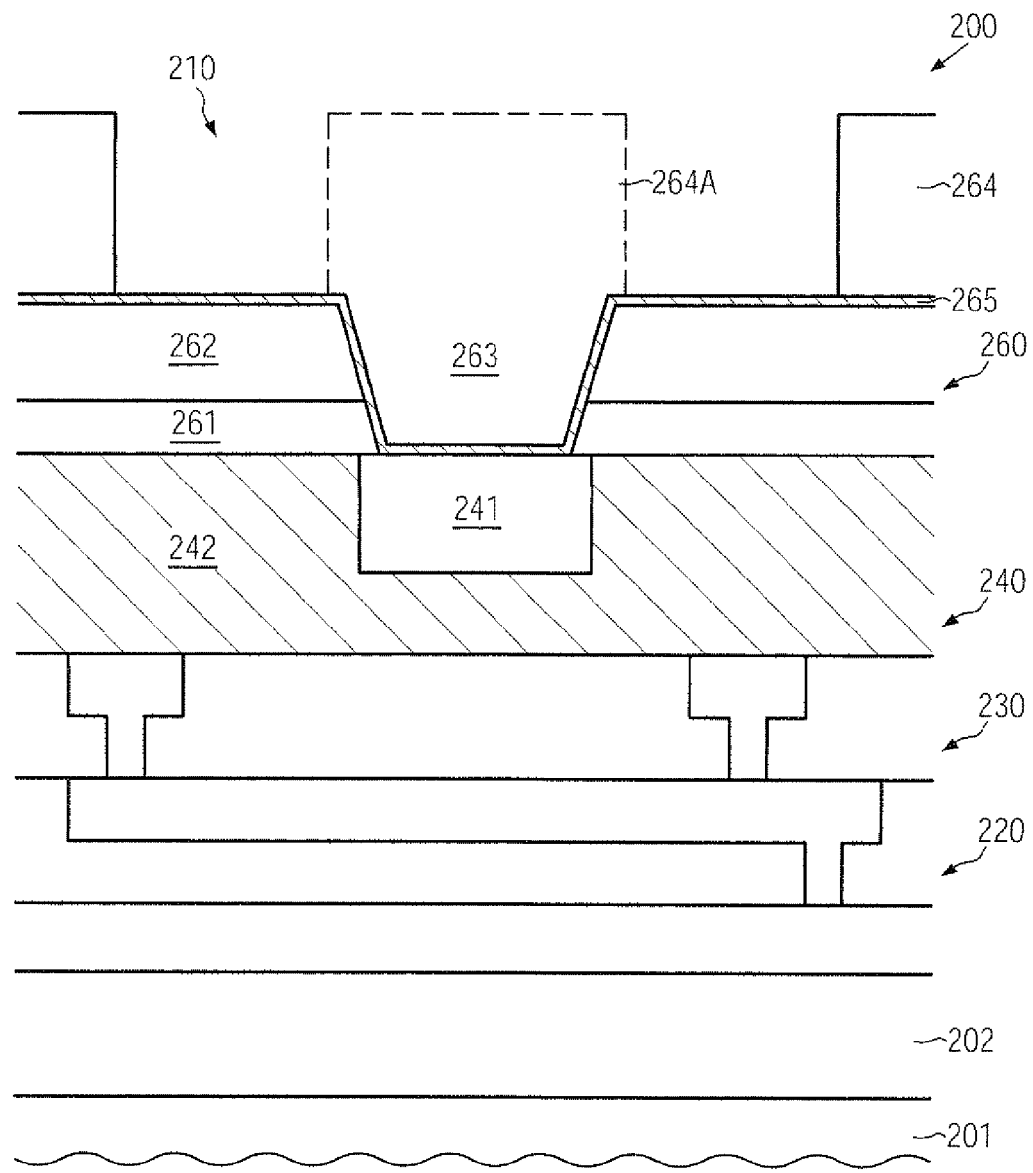
FIGS. 2a-2d schematically illustrate cross-sectional views of a semiconductor device during various manufacturing stages in forming a pillar in a metallization system based on a stress distribution component for reducing the local stress load, according to illustrative embodiments.

FIG. 2a schematically illustrates a cross-sectional view of a semiconductor device 200 in an advanced manufacturing stage. As illustrated, the semiconductor device 200 may comprise a substrate 201, such as a silicon substrate, an SOI substrate and the like, as is required for the overall configuration of the device 200. Moreover, a device level or semiconductor layer 202 may be formed above the substrate 201 and may comprise a large number of circuit elements, such as transistors, capacitors, resistors and the like, which may be formed on the basis of appropriate design rules corresponding to the device 200. For instance, critical dimensions of circuit elements in the device level 202 may be approximately 50 nm or less, depending on the overall device requirements. It should be appreciated that, although the techniques disclosed herein are highly advantageous in the context of complex semiconductor devices, a corresponding regime for forming a pillar structure may also be advantageously applied to less critical semiconductor devices in which the circuit elements may have critical dimensions of 50 nm and more. Furthermore, the semiconductor device 200 may comprise a metallization system 210 which typically includes a plurality of metallization layers 220, 230, 240, at least some of which may, in some illustrative embodiments, include sensitive dielectric materials, as previously discussed. Moreover, a last metallization layer 240, which may also be referred to as a final contact layer, may have formed therein a metal region in the form of a contact pad 241, which may be comprised of any appropriate material, such as copper, aluminum, copper/aluminum and the like. It should be appreciated that, in sophisticated metallization systems, the metal lines and vias may be provided on the basis of a copper material due to superior characteristics in view of thermal and electrical conductivity, as is also previously discussed. It should be appreciated, however, that metallization systems including other materials, such as aluminum, silver and the like, possibly in combination with other metals, may also be contemplated herein. Moreover, the contact pad 241 may comprise any appropriate barrier material, if required, in order to reliably confine a corresponding metal, such as copper, when a direct contact of the metal with the surrounding dielectric material 242 may be considered inappropriate. Moreover, a final passivation layer 260 may be formed above the last metallization layer 240 and may comprise two or more sub-layers 261, 262, as is required in view of the overall characteristics with respect to passivation, mechanical integrity and the like. For example, the first sub-layer 261 may be comprised of silicon dioxide, silicon nitride and the like, while the second sub-layer 262 may represent a passivating material, such as polyimide and the like. In the manufacturing stage shown, an opening 263 may be formed in the final passivation layer 260 so as to extend to the contact pad 241, wherein a corresponding lateral dimension of the opening 263, as well as a thickness of the final passivation layer 260, may be selected on the basis of appropriately defined conditions for enhancing the stress distribution effect of the layer 260, as will be explained in more detail with reference to FIGS. 2h and 2i later on. In other illustrative embodiments, the width or diameter of the opening 263 may be formed in accordance with well-established process strategies so that the corresponding characteristics of the final passivation layer 260 and of the opening 263 may be compatible with conventional strategies for forming a pillar above the final passivation layer 260. Furthermore, a mask 264 may be provided to define the position and the lateral size of the stress distribution component or element that connects to the metal pillar still to be formed above the final passivation layer 260. It should be appreciated that the lateral size defined by the mask 264 may be significantly greater than a corresponding lateral size or diameter of a corresponding metal pillar still to be formed. That is, for a desired diameter of a corresponding metal pillar of approximately 30-100 μm, the lateral size exposed by the mask 264 may be in the range of approximately 50-200 μm, thereby providing a significantly increased surface area that may be available for transferring and thus distributing stress from a metal pillar into the final passivation layer 260.

The semiconductor device 200 as shown in FIG. 2a may be formed on the basis of the following process strategy. Circuit elements in the device level 202, as well as the metallization system 210, including the metallization layers 220, 230 and 240, may be formed on the basis of well-established process strategies so that a high degree of compatibility with a desired technology standard and process flow may be maintained. Thereafter, the final passivation layer 260 may be formed, for instance, by depositing corresponding dielectric materials, such as the sub-layers 261 and 262, and subsequently patterning the same by well-established lithography techniques. For example, the polyimide material 262 may be provided in the form of a photosensitive material and may be patterned by a corresponding development process, followed by the etching of the layer 261. In other cases, a corresponding resist mask may be provided to etch through the final passivation layer 260 in order to expose a portion of a contact pad 241. If required, any appropriate barrier material 265 may be deposited, if required, in order to confine a corresponding reactive metal, such as copper, if direct contact with the materials of the passivation layer 260 may be considered inappropriate. Moreover, the layer 265 may be advantageous in view of enhanced adhesion of a metal to be formed in the opening 263 and on exposed portions of the final passivation layer 260. For this purpose, any appropriate materials, such as chromium, copper, tantalum, tantalum nitride and the like, or combinations of various materials, may be used. Thereafter, the mask 264 may be provided, for instance in the form of a resist material and the like. In some illustrative embodiments, the mask 264 may also cover the opening 263, as indicated by the mask portion 264A, when a material filled into the opening of the mask 264 may not be compatible with the required thermal and electrical performance so as to connect the contact pad 241 to a metal pillar still to be formed. For example, after forming the mask 264, a metal material may be deposited, for instance by electrochemical deposition techniques, wherein, if provided, the layer 265 may act as a current distribution layer, thereby enabling an electroplating process. In other cases, an electroless plating process may be performed, in particular when the layer 265 may not be provided, so that a corresponding metal deposition may be initiated upon contact with the contact pad 241. In other cases, when the mask portion 264A may cover the opening 263, an appropriate bottom-to-top fill behavior may be obtained on the basis of the layer 265 during an electroless deposition process. It should be appreciated that any appropriate metal may be filled in, for instance copper, aluminum, tungsten and the like. For instance, if a material is desired that provides per se for a high degree of adhesion to the passivation layer 260 or the material 265, and which may also strongly adhere to the metal to be used for the metal pillar, a corresponding anchor or ring of this material may be formed on the basis of the mask portion 264A. In other illustrative embodiments, the opening of the mask 264 may be filled with the same metal that may also be used for providing the metal pillar, so that, during the corresponding fill process, the opening 263 may also be filled on the basis of well-established deposition techniques. For example, copper may be filled into the opening of the mask 264. Thereafter, the mask 264, possibly in combination with the portion 264A, may be removed and, if required, a corresponding cleaning process may be performed, for instance on the basis of wet chemical etch recipes.

Figure 2B:
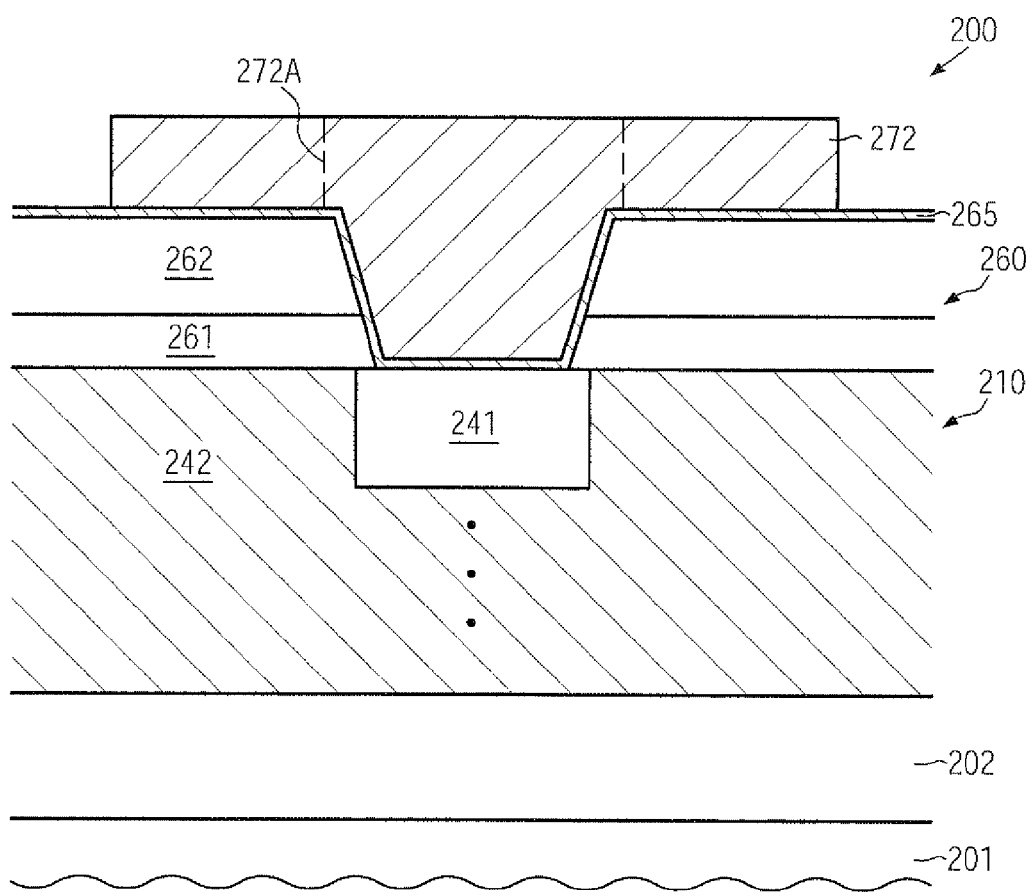

FIG. 2b schematically illustrates the semiconductor device 200 after the above-described process sequence. As illustrated, a stress distribution component or element 272 may be formed above the final passivation layer 260 and, in the embodiment shown, may extend into the opening 263 (FIG. 2a) so as to electrically connect to the contact pad 241 via the layer 265, if provided. In other illustrative embodiments, the stress distribution element 272 may not comprise an interior portion 272A, as indicated by the dashed lines, when the mask portion 264A (FIG. 2a) has been used during the deposition of the corresponding material. In the embodiment shown, the element 272 may be comprised of a highly conductive metal, such as copper and the like.

Figure 2C:
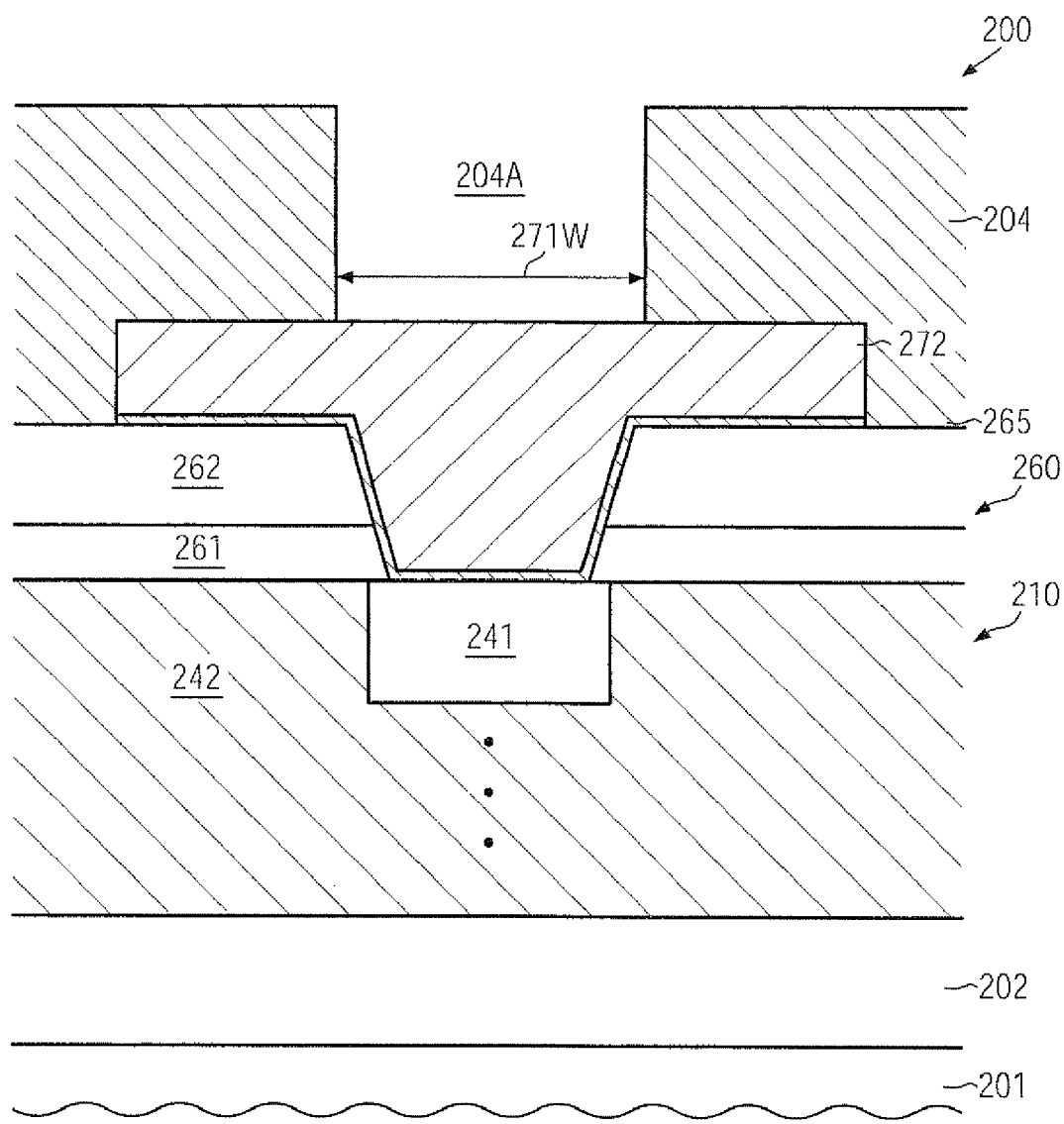

FIG. 2c schematically illustrates the semiconductor device 200 in a further advanced manufacturing stage in which a deposition mask 204, such as a resist mask, is formed above the metallization system 210, which comprises an opening 204A, the lateral dimension 271W of which may correspond to the diameter or lateral size of a metal pillar to be formed in the opening 204A. It should be appreciated that, depending on the deposition technique to be used for filling in an appropriate metal into the opening 204A, the barrier layer 265 may have been removed from exposed portions of the final passivation layer 206, while, in other cases, the layer 265 may still be present so as to act as a current distribution layer for an electroplating process. In other cases, electroless deposition recipes may be used, wherein the stress distribution element 272 may act as a catalyzing material.

Figure 2D:
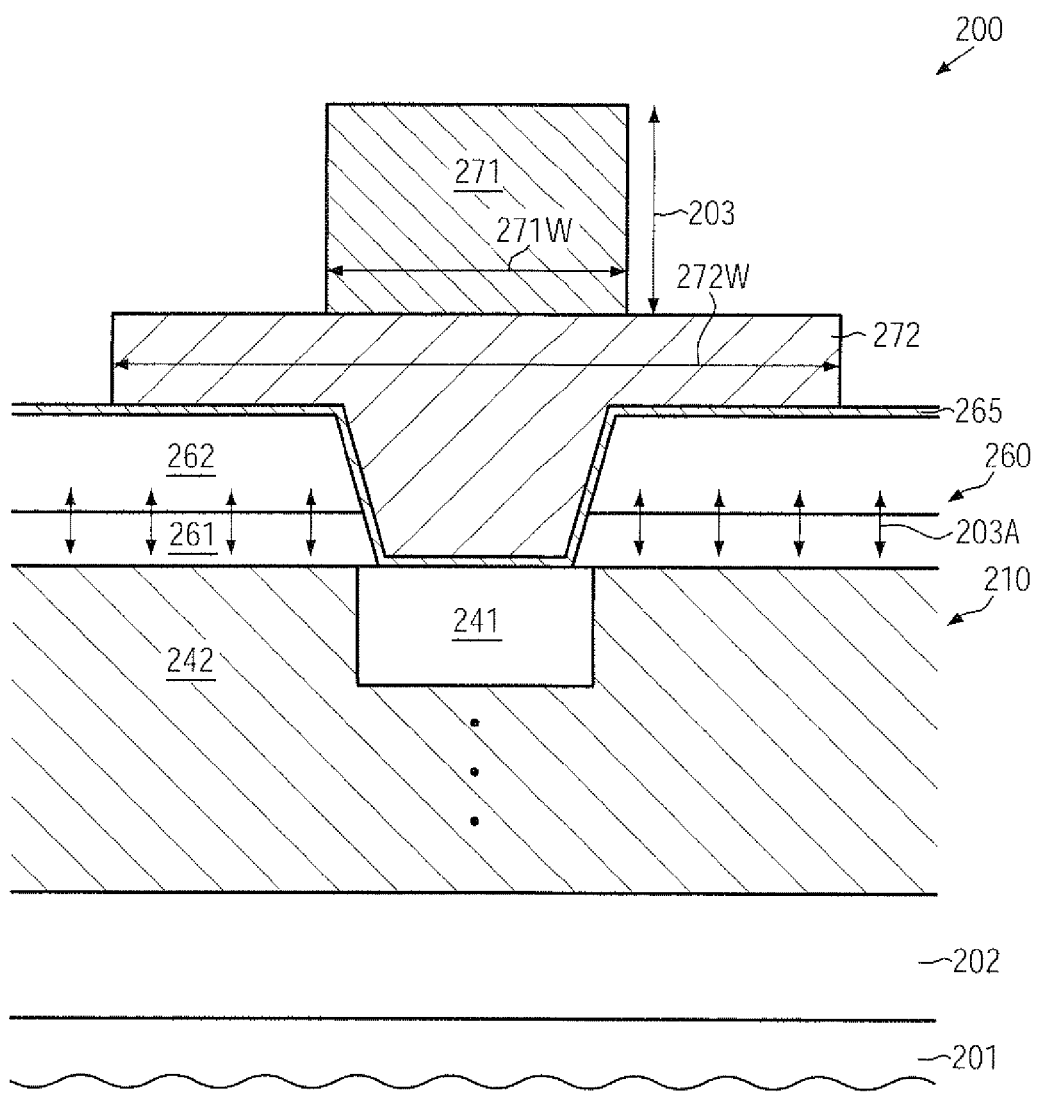

FIG. 2d schematically illustrates the semiconductor device 200 in an advanced manufacturing stage in which a metal pillar 271 is formed above the final passivation layer 260 so as to extend therefrom, wherein, in the embodiment shown, the metal pillar 271 may be formed on the stress distribution element 272. Thus, as illustrated, the lateral width of the stress distribution element 272, indicated as 272W, is significantly greater compared to the diameter or width 271W, so that the pillar 271 may be attached to the final passivation layer 260 via the element 272, thereby enabling an efficient distribution of a mechanical stress 203 which may be caused by attaching the pillar 271 to a package substrate, as is also previously explained with reference to FIG. 1 and the integrated circuit 150. Consequently, the high magnitude of the stress component 203 may be distributed via the element 272, thereby resulting in a reduced local stress component 203A, which may be distributed across an increased lateral area of the metallization system 210.

Figure 2E:
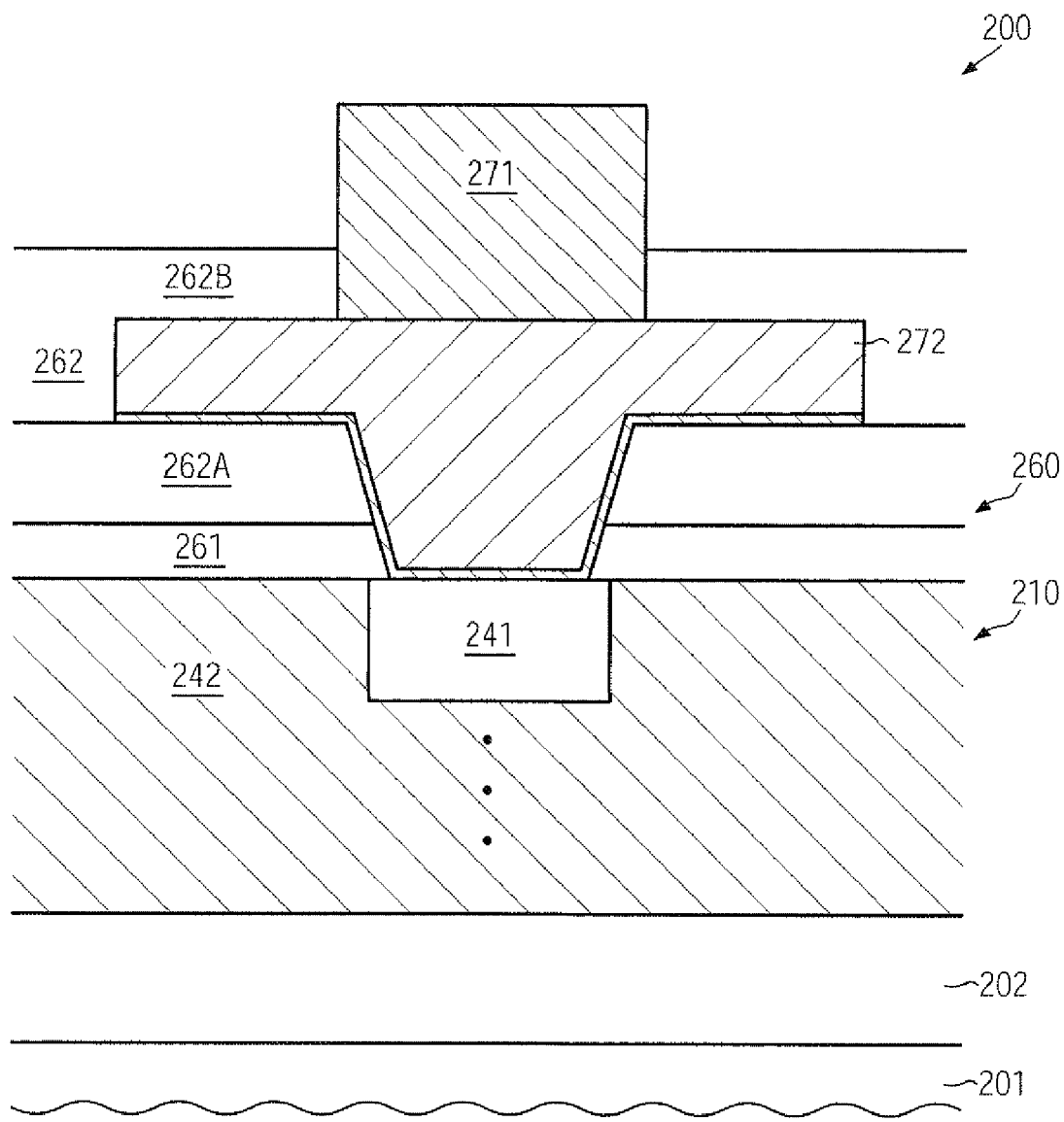
FIG. 2e schematically illustrates a cross-sectional view of a semiconductor device in which a corresponding stress distribution element or a lateral extension of a pillar may be embedded in a sub-layer of a final passivation layer, according to further illustrative embodiments.

FIG. 2e schematically illustrates the semiconductor device 200 according to other illustrative embodiments in which the stress distribution element 272 may be embedded in the final passivation layer 260. In the embodiment shown, the element 272 may be formed within a second sub-layer 262, which may be accomplished by depositing a first portion 262A of the layer 262 and forming thereon the element 272 on the basis of a corresponding mask, such as the mask 264 (FIG. 2a) and depositing an appropriate material such as a metal. Thereafter, a further portion 262B may be deposited and may be patterned so as to expose a portion of the element 272 on the basis of lateral dimensions as are required for forming the metal pillar 271. Thus, after opening the portion 262B, a desired metal may be deposited, as previously described. It should be appreciated that, after forming the element 272, any appropriate cap material or barrier material may be formed on exposed surface areas of the element 272, if a reliable confinement may be considered appropriate. For instance, a selective deposition of a plurality of well-established metal alloys may be accomplished on the basis of electroless deposition techniques. Thereafter, the portion 262B may be deposited and patterned in accordance with any lithography techniques as previously described. Thereafter, an appropriate mask may be provided and the pillar 271 may be deposited as described above. Consequently, by embedding the element 272 in the final passivation layer 260, an even further increased surface area of the passivation layer 260 may be in contact with the element 272, which in turn is tightly mechanically coupled to the pillar 271. Thus, the element 272 may represent an anchor for the pillar 271, wherein the increased surface area may also provide an efficient distribution of any mechanical stress components acting on the pillar 271.

Figure 2F:
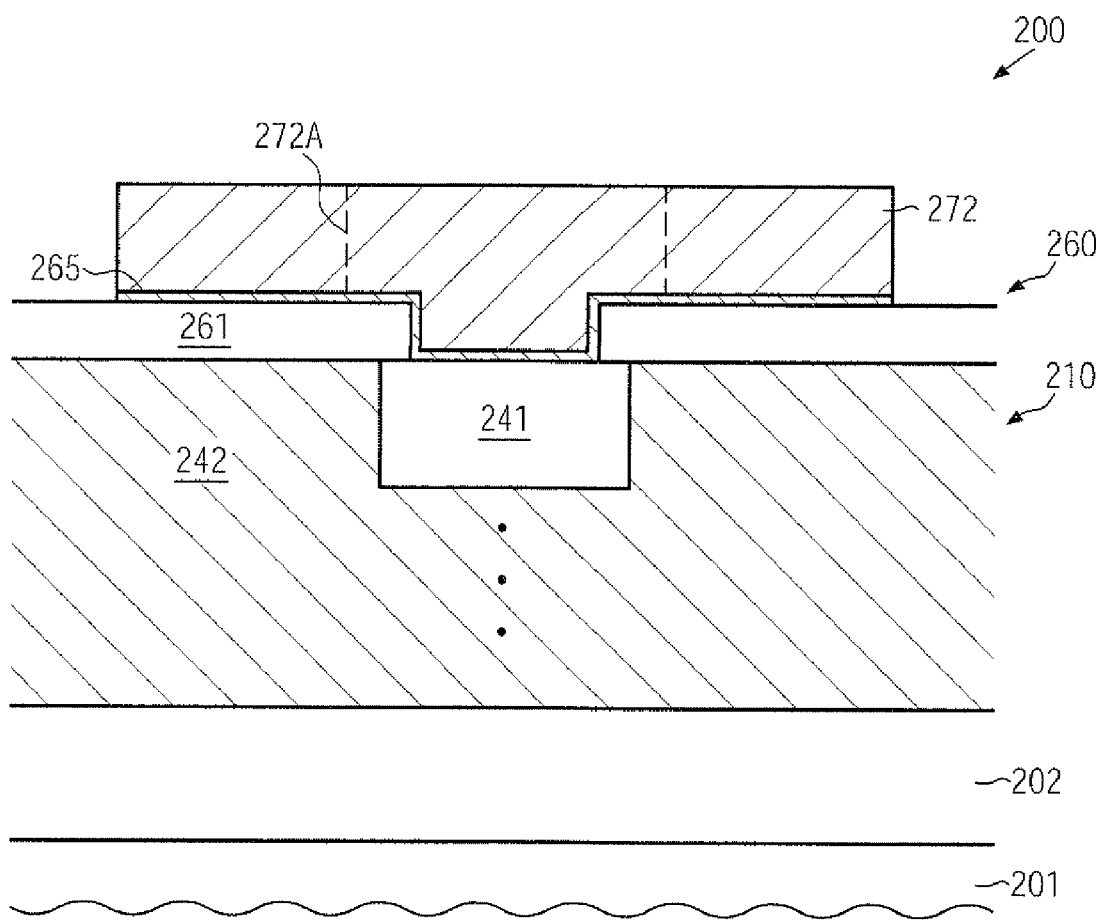
FIGS. 2f-2g schematically illustrate cross-sectional views of the semiconductor device during different manufacturing stages when a corresponding stress distribution component or lateral extension of a pillar may be formed on a first sub-layer of the final passivation layer, according to illustrative embodiments.

FIG. 2f schematically illustrates the semiconductor device 200 according to further illustrative embodiments in which the stress distribution element 272 may be formed on the sub-layer 261, wherein it should be appreciated that a corresponding barrier material 265, if provided, may be considered as being a part of the element 272. Moreover, it is to be noted that, as previously explained, the element 272 may be provided without the central portion 272A, depending on the overall process strategy. The element 272 as shown in FIG. 2f may be formed on the basis of similar process techniques as discussed above. That is, after depositing the sub-layer 261 and patterning the same for connecting to the contact pad 241, the barrier material 265, if required, may be deposited and a corresponding mask may be formed so as to allow the deposition of an appropriate material, such as a metal, in order to provide the element 272, as described above. It should be appreciated that a corresponding opening connecting to the contact pad 241 may also be formed in a later stage if the element 272 is provided as an annular component without a central portion 272A.

Figure 2G:
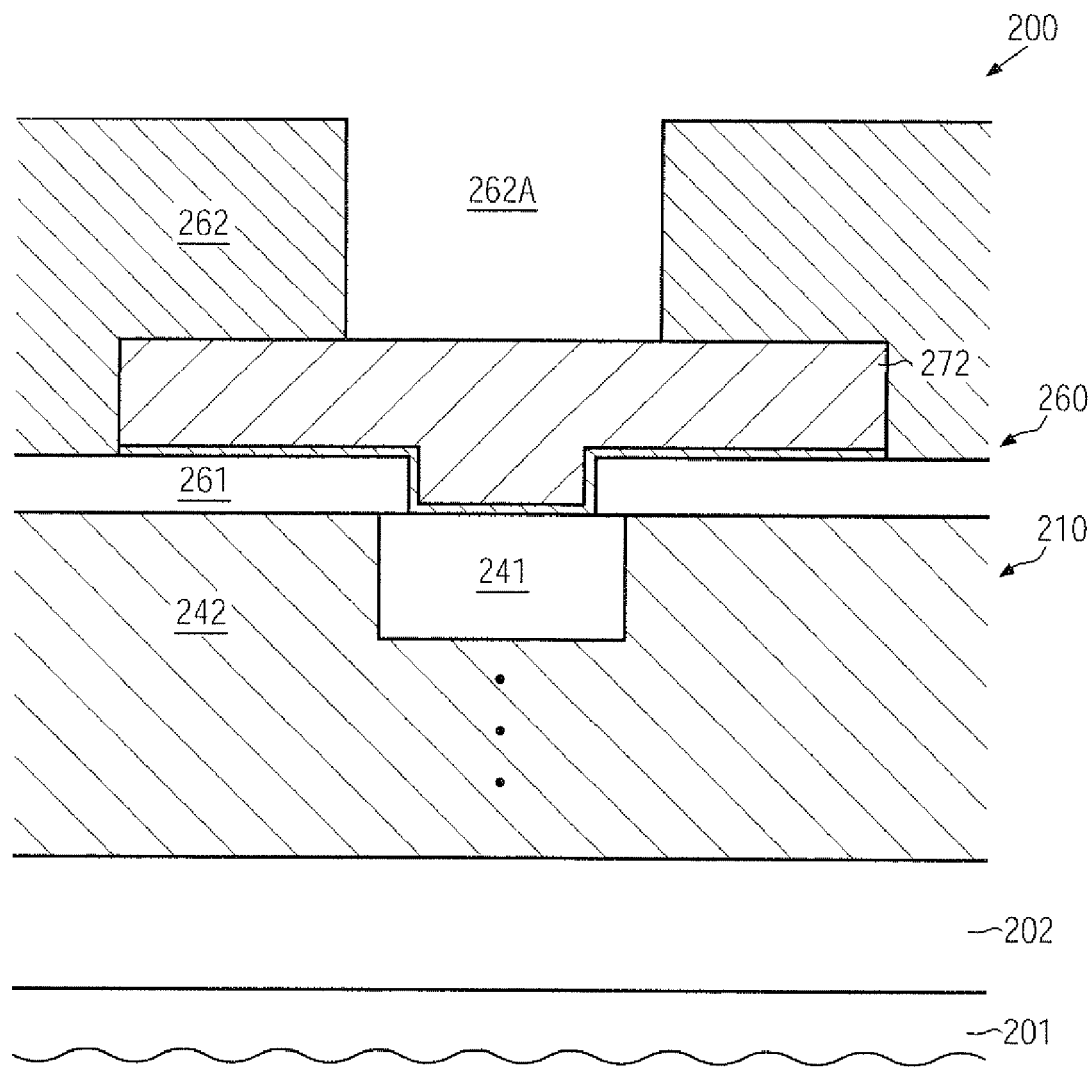

FIG. 2g schematically illustrates the semiconductor device 200 in a further advanced manufacturing stage in which the second sub-layer 262 is provided and patterned so as to have an opening 262A. Thereafter, the further processing may be continued by providing a corresponding deposition mask and filling the opening 262A and a corresponding opening of the deposition mask by an appropriate metal, such as copper, thereby also forming a corresponding metal pillar, as is also discussed above. It should be appreciated that the element 272 may receive an appropriate barrier material prior to the deposition of the sub-layer 262 if deemed appropriate. For this purpose, similar process techniques as previously discussed may be used.

Consequently, also in this case, the stress distribution element 272 may be efficiently embedded in the final passivation layer 260, thereby providing enhanced mechanical stability and a highly efficient stress distribution effect.

Figure 2H:
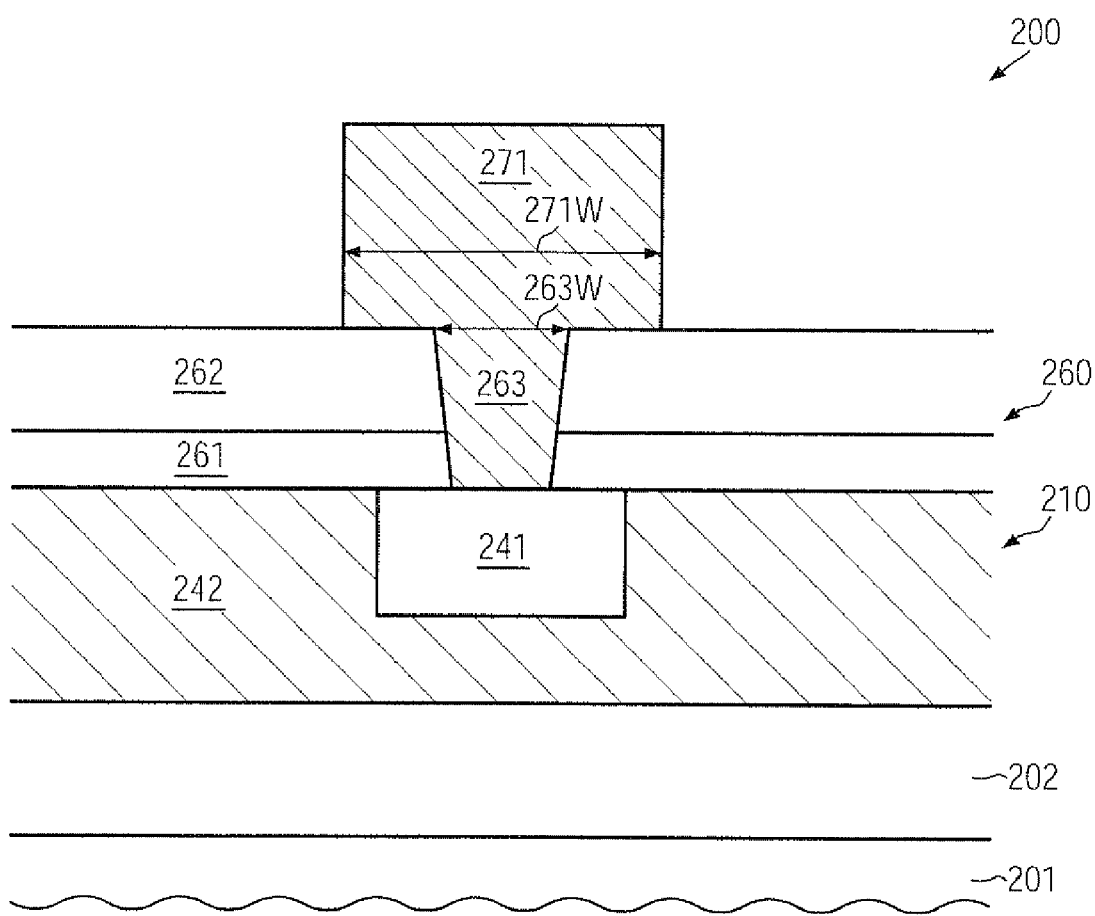
FIG. 2h schematically illustrates a cross-sectional view of a metallization system in an advanced manufacturing stage in which the ratio of a diameter of an opening in a final passivation layer with respect to the diameter of a pillar are appropriately adjusted so as to enhance the stress distribution, according to further illustrative embodiments.

FIG. 2h schematically illustrates the semiconductor device 200 according to further illustrative embodiments in which the metal pillar 271 may be formed on the final passivation layer 260 such that an increased surface area thereof may be in contact with the pillar 271 compared to conventional strategies, which may be accomplished by appropriately reducing a lateral width 263W of the opening 263 that has previously been formed in the final passivation layer 260 and filled with a metal, for instance during the formation of the metal pillar 271. In some illustrative embodiments, a ratio of the width 271W and the width 263W may be selected to be approximately 1.5 or greater. Since the surface area occupied by the metal pillar 271 increases quadratically with reducing the width 263W, a significant increase of the stress distribution effect may be obtained by selecting the corresponding ratio on the basis of the above-specified dimensions. In further illustrative embodiments, the ratio of the diameter 271W and the diameter of the opening 263W may be selected to be approximately 2.0 or greater.

In some illustrative embodiments, the concept of appropriately selecting the ratio of the width 271W and the width 263W may be advantageously combined with providing a stress distribution element, such as the element 272 as illustrated in FIGS. 2e-2f, so that in addition to an increased surface area that is occupied by the pillar 271 on the layer 262, additionally, the embedded element 272 may provide further efficiency of the stress distribution effect.

Figure 2I:
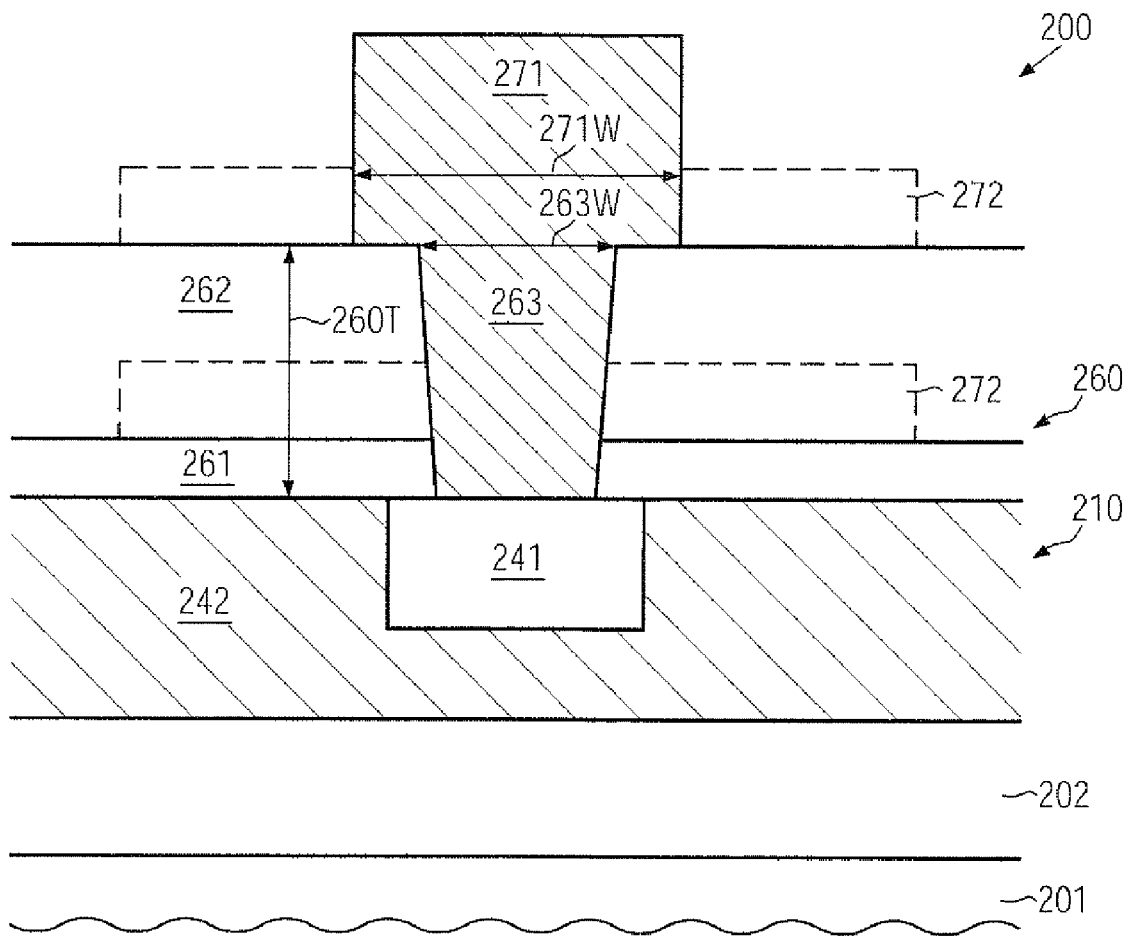
FIG. 2i schematically illustrates a metallization system including a pillar which may be formed on the basis of an appropriately selected ratio of the thickness of the final passivation layer and the diameter of the pillar for enhancing the stress buffering effect of the final passivation layer, according to yet other illustrative embodiments.

FIG. 2i schematically illustrates the semiconductor device 200 according to further illustrative embodiments in which an increase of stress transfer efficiency may be accomplished by appropriately selecting the ratio of a thickness 260T of the final passivation layer 260 and the diameter 271W of the pillar 271 to be approximately 0.5 or greater. That is, by providing an increased thickness 260T, the material connecting the pillar 271, i.e., the portion extending from the final passivation layer 260 to the contact pad 241, may be attached to a significantly increased surface area of the passivation layer 260. Consequently, any mechanical forces acting on the pillar 271 may be more efficiently transferred into the final passivation layer 260 thereby also obtaining the desired stress distributing effect. For example, in one illustrative embodiment, the ratio of the thickness 260T to the diameter 271W may be selected to be 1.0 or even greater. It should be appreciated that, in addition to increasing the thickness 260T according to the above-specified ratio, the width 263W may also be reduced so as to additionally provide an enhanced surface portion that may be occupied by the pillar 271, as is also explained with reference to FIG. 2h. Furthermore, the embodiment described with reference to FIG. 2i may also be combined with any of the embodiments referring to the stress distribution element 272 as shown in FIGS. 2d, 2f and 2g. For example, the element 272 may be embedded in the passivation layer 260, as previously discussed, and/or the element 272 may be formed on the passivation layer 260, possibly in combination with an additional element provided within the passivation layer 260.

As a result, the present disclosure provides semiconductor devices and manufacturing techniques in which the local stress level in the vicinity of a metal pillar may be reduced by efficiently distributing the stress component into the passivation layer. Consequently, appropriate dimensions of the metal pillar may be used, for instance in view of a desired height and lateral width, while sensitive dielectric materials may also be used in the metallization system without unduly contributing to stress-related effects.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A semiconductor device, comprising:
   a final passivation layer formed above a final contact layer, said final passivation layer comprising an opening aligned to a contact pad formed in said final contact layer of a metallization system formed above a substrate, said opening having a first width;
   a metal pillar extending from said final passivation layer and having a second width approximately equal to the first width, said metal pillar being in contact with said contact pad; and
   a stress distribution element formed in contact with said final passivation layer, said stress distribution element being in contact with a portion of said metal pillar and having a third width that is larger than the first width, wherein said stress distribution element is formed on said final passivation layer so as to circumferentially enclose said portion of said metal pillar.

2. The semiconductor device of claim 1, wherein a ratio of the third width to the first width is 1.5 or greater.

3. The semiconductor device of claim 2, wherein the ratio of the third width to the first width is 2.0 or greater.

4. The semiconductor device of claim 1, wherein said stress distribution element is comprised of a metal.

5. The semiconductor device of claim 1, wherein said metal pillar comprises copper.

6. The semiconductor device of claim 1, wherein the second width of said metal pillar is approximately 30-100 µm.

7. The semiconductor device of claim 1, wherein the third width of said stress distribution element is in the range of approximately 50-200 µm.

8. A semiconductor device, comprising:
   a metallization system formed above a substrate, said metallization system comprising a plurality of metallization layers and a final contact layer comprising a contact pad;
   a final passivation layer formed above said final contact layer, said final passivation layer comprising an opening aligned to said contact pad, said opening having a first width;
   a metal pillar extending from said final passivation layer, said metal pillar being in contact with said contact pad; and
   a stress distribution element formed in contact with said final passivation layer, said stress distribution element being in contact with a portion of said metal pillar and having a second width that is at least a factor of 1.5 larger that the first width, wherein said stress distribution element is formed on said final passivation layer so as to circumferentially enclose said portion of said metal pillar.

9. The semiconductor device of claim 8, wherein said stress distribution element is comprised of a metal.

10. The semiconductor device of claim 8, wherein said metal pillar comprises copper.

11. The semiconductor device of claim 8, wherein a width of said metal pillar is approximately 30-100 µm.

12. The semiconductor device of claim 8, wherein said stress distribution element has a second width in the range of approximately 50-200 µm.

13. The semiconductor device of claim 12, wherein said stress distribution element is comprised of copper.

14. The semiconductor device of claim 8, wherein a ratio of the first width to the second width is 2.0 or greater.

15. The semiconductor device of claim 8, wherein a third width of the metal pillar is substantially equal to the first width.

16. The semiconductor device of claim 12, wherein said stress distribution element is comprised of copper.

* * * * *